United States Patent [19]

Hogan et al.

[11] Patent Number: 5,223,670
[45] Date of Patent: Jun. 29, 1993

[54] HINGED DOOR ASSEMBLY

[75] Inventors: Roger C. Hogan, Maryhill; Kathleen M. Engberg, Kitchener, both of Canada

[73] Assignee: Her Majesty the Queen in Right of Canada, Canada

[21] Appl. No.: 804,223

[22] Filed: Dec. 2, 1991

[51] Int. Cl.⁵ .............................................. H05K 9/00
[52] U.S. Cl. ............................ 174/35 MS; 174/35 R; 361/424
[58] Field of Search ................. 174/35 R, 35 MS, 50, 174/52.1, 35 GC; 361/424

[56] References Cited

U.S. PATENT DOCUMENTS 4,590,710  5/1986  Newland ........................ 174/35 GC

FOREIGN PATENT DOCUMENTS 0306694  3/1989  European Pat. Off. .......... 174/35 R

*Primary Examiner*—Leo P. Picard
*Assistant Examiner*—Bot L. Ledinh
*Attorney, Agent, or Firm*—Anthony Asquith & Co.

[57] ABSTRACT

A cabinet is shielded against electromagnetic interference. The openable door thereof is sealed by conventional fingerstock. The door includes a forward-facing blade-like flange all round the door, and the fingerstock is so placed in a recess in the door frame as to wipe the sides of the flange, as the door is closed. The door is provided with two hinge pivots, connected by a bar: over the last portion of the door closing movement the door is thereby able to travel in an (almost) straight line into the door frame. Four latch assemblies, operated by a manual door handle, are provided, and include cams to assist in drawing the door into the frame.

8 Claims, 7 Drawing Sheets

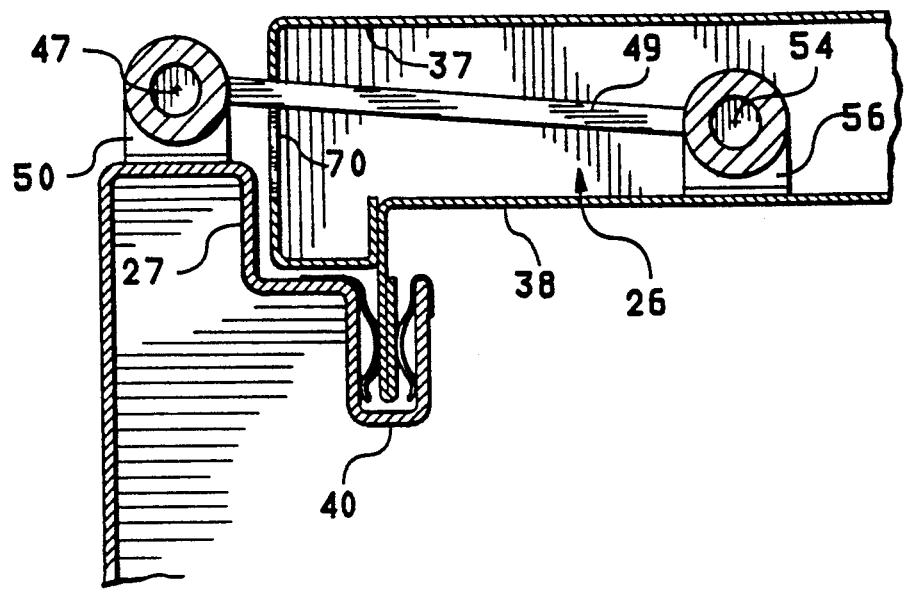
FIG.2.A.
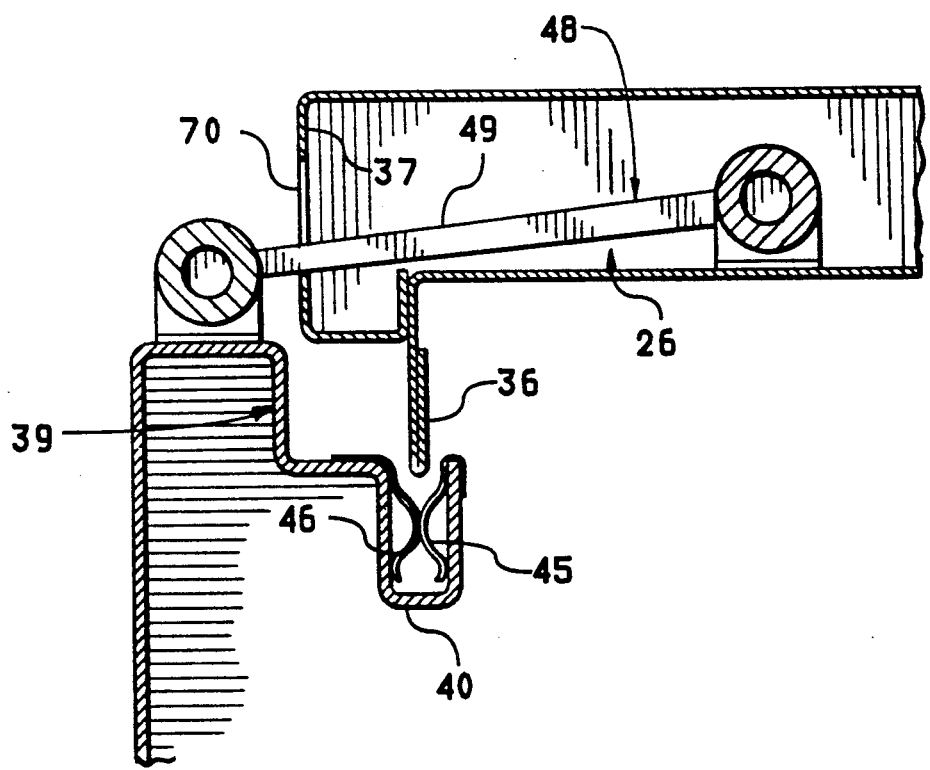
FIG.2.B.

HINGED DOOR ASSEMBLY

This invention relates to an assembly of a doorframe and door, and relates in particular to a manner of rendering the door assembly leakproof. The invention especially relates to a manner of rendering the door assembly of a shielded cabinet proof against leakage of electromagnetic radiation.

BACKGROUND TO THE INVENTION

It is a common practice to place security-sensitive computers and other apparatus which emits electromagnetic radiation (EMR), or which is receptive to electromagnetic interference (EMI), inside a shielded cabinet. When such a cabinet is intended to remain closed, the task of sealing the cabinet against EMI or EMR is not a very demanding one.

The conventional non-openable cabinets typically have used compression-type gaskets to seal the joints between the various components of the cabinet. It is also known, in the case of a cabinet which has a removable panel of the occasional-access type, to provide the panel with a flange in the form of a forwardly directed blade, and to provide the panel opening with a seal strip which has bendy fingers.

These bendy fingers press laterally against the sides of the flange. The flange engages the fingers with a wiping action as the panel is assembled into the opening. This type of seal is very effective and reliable.

Such an arrangement of a blade-like flange and a wiper seal requires a straight line motion of the panel into the opening. The required straight line motion, furthermore, has a considerable length of travel, typically 2 cm or so of movement of the panel between the position in which the blade or flange is fully closed into the seal strips and the position in which the blade is quite clear of the seal strips.

The arrangement of a blade-like flange and a wiper seal may be applied to a removable panel, as described, where providing the 2 cm of straight line travel is not difficult. The arrangement may also, in some cases, be applied to the hinged door of a room.

In the case of a hinged door for a room, it is generally a simple matter to position the hinge axis in such a place that a near-enough approximation to the required 2 cm or so of straight line travel of the door can be achieved.

For a hinged door, a line drawn, in the plan view, from the hinge axis to the nearest point of the line of engagement between the seal strip and the flange, should be at least 10 cm or so long. Also, this line should lie in, or near, the plane of the door frame.

When these conditions are met, the arcuate travel of the door about the hinge axis has such a small lateral component, at least over the 2 cm of door-closing movement, that the flange moves, relative to the seal strip, in what amounts to a straight line, perpendicular to the door frame.

Thus the blade-like-flange-and-wiper-seal arrangement, with its requirement for straight-line, or almost straight-line, travel of the flange into the seal strip, may be used where the door hinge axis is positioned 10 cm or so away from the seal.

It is recognised that such positioning of the hinge can be achieved relatively easily in the case of the door of a room, but in the case of a door for a shielded cabinet, inevitably the hinge axis has to be much closer to the edge of the door, i.e. to the seal, than 10 cm.

It is an aim of the invention to provide a means by which the blade-like-flange-and-wiper-seal arrangement, even though that arrangement has a requirement for 2 cm or so of straight-line, or almost straight-line, travel of the flange into the seal strip, can be utilised for an openable, hinged door of a shielded cabinet.

GENERAL FEATURES OF THE INVENTION

The invention provides a doorframe and door assembly. Either the door or the doorframe, preferably the door, is provided with a sealing surface, which, when the door is closed, lies substantially perpendicular to the plane of the doorframe. The other is provided with a seal element which, when the door is closed, lies in operative engagement with the sealing surface.

The seal element includes a resiliently deflectable arm, which is deflectable in the direction perpendicular to the sealing surface, and the arm of the seal element is able to rub against the sealing surface with a wiping action, upon closure of the door.

The assembly includes a door hinge sub-assembly. This door hinge sub-assembly defines a main hinge axis, about which the door is pivotable, when open.

The assembly includes a means for permitting non-hinged movement of the door. The non-hinged movement means is effective to guide the door for bodily movement of the door relative to the hinge axis, and for free movement in a substantially straight line, perpendicular to the plane of the doorframe, upon closure of the door, from a seal-start position of the door to a fully-closed position of the door.

The said seal-start position is a position of the door in which the seal element is just starting to engage the sealing surface.

The assembly includes an operable latching means. The latching means is effective, when operated, to hold the edges of the door member firmly in a fully closed relationship with the edges of the door frame member.

In short, the door frame and door assembly of the invention, in order to permit the use of seal elements or seal strips of the kind which are deflectable in a direction which lies in the plane of the doorframe, has basically two attributes: (a) the hinges of the door are so arranged as to permit a substantially linear movement of the whole door into the door frame, over the final portion of door-closing movement; and (b) the door has a latch assembly, for latching the door in the fully closed position.

The force required to draw the flanges into the seal strips can be quite considerable. This force requires to be exerted in the door closing direction, and requires to be exerted over the whole extent of the non-hinged movement. In the non-hinged movement, as mentioned, the door is permitted to move bodily, i.e. the door is not under constraint solely to pivot about the hinge axis. As mentioned, in a typical case, during this non-hinged movement, the door travels bodily into the door frame a distance of about 2 cm.

It would be a considerable inconvenience if the door operator had to provide this final door-closing force by pushing or leaning against the door, especially if the means for reacting the pushing force were solely the person's frictional contact with the ground. Preferably, therefore, the assembly includes a reaction means, which is operatively integral with the door frame, and which is effective to provide a reaction to a force applied to the door in a door-closing direction, and includes a means for applying the said force.

Conveniently, the reaction means is incorporated into the latching means. The latching means provides a means by which forces between the door and the door frame may be applied and reacted. When the latching means is operated, a suitable cam, or other appropriate mechanism, acts to draw the door into the door frame. A handle may be provided to operate the latching means via a linkage, and the handle may incorporate a suitable lever ratio.

As will be described, the handle may be so structured as to constitute the sole means by which the operator controls the movement of the door: i.e., the handle serves as a normal door handle, and serves also to operate the latches to draw the door into the door frame—and to withdraw the door from the door frame, as required.

The force required to draw the door in against the resistance of the seal strips can be considerable. It is recognised that it is possible to provide a linkage, in conjunction with the latching means, which is effective to draw the door into the door frame over a long distance, i.e. over a distance of 2 cm or thereabouts, against this considerable force.

DETAILED DESCRIPTION OF PREFERRED EMBODIMENT

By way of further explanation of the invention, an exemplary embodiment of the invention will now be described with reference to the accompanying drawings, in which:

FIG. 2A is a close-up of a portion of the view of FIG. 1, showing the door in a closed position;

FIG. 2B is the same view as FIG. 2A, but shows the door in a seal-start position;

The apparatus shown in the accompanying drawings and described below are examples which embody the invention. It should be noted that the scope of the invention is defined by the accompanying claims, and not necessarily by specific features of exemplary embodiments.

Figure 1:
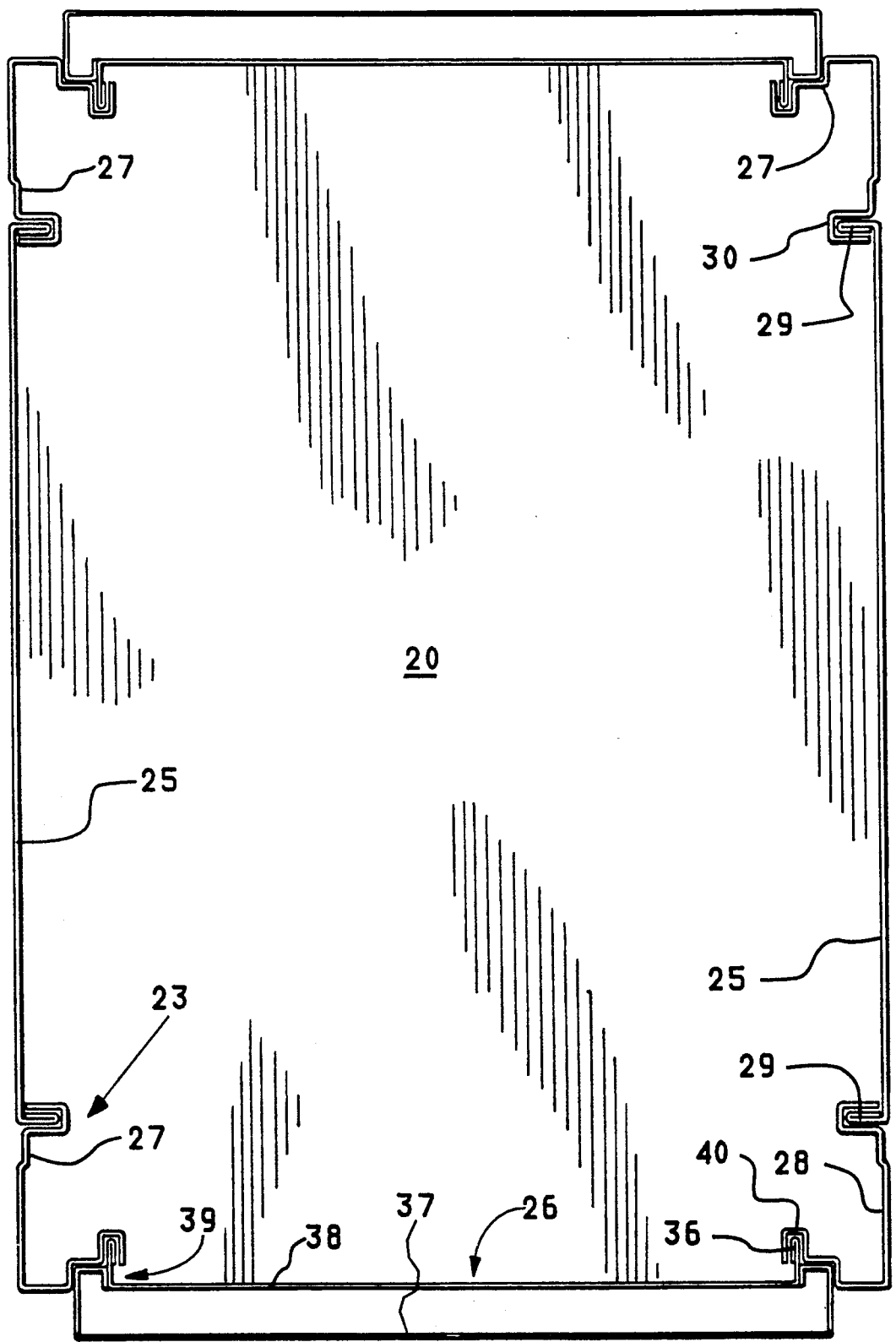
FIG. 1 is a sectioned plan view of a cabinet, which has a door assembly which embodies the invention.

FIG. 1 shows a shielded cabinet 20, which is suitable for use in housing high-security computers and other EMR-emitting, and EMI-receptive, apparatus.

The cabinet 20 comprises a base-frame 23, left and right side panels 25, a floor, a roof, a front door 26, and a back door. The base-frame 23 comprises basically four corner posts 27,28, which are connected to top and bottom rails.

Each side panel 25 comprises a rectangle of sheet steel, the edges of which are turned over to form blade-like flanges 29. The posts 28 and rails are provided with complementary recesses 30, into which the flanges 29 enter when the panel 25 is assembled into the base-frame.

The recess 30 is provided with EMI seal-strip (not shown in FIG. 1), which comprises a strip of thin flexible material, typically beryllium-copper. The seal-strip defines a bendy arm. The flange 29 on the panel 25, upon entering the recess 30, passes over the arm with a wiping action, compressing the arm against the side wall of the recess. Thus, the direction in which the seal arm 35 is compressed is the direction perpendicular to the direction in which the flange is entered into the recess.

The arm 35 shown in FIG. 1 is interrupted or divided at intervals, so that the arm 35, shown only in cross-section in FIG. 1, may be more appropriately considered to be in the form of fingers. The seal-strip 34 itself is termed fingerstock. The individual fingers, and the seal-strip itself, are flexible enough that the fingers resiliently touch the flange over the whole length of the flange. It is known in the art that such fingerstock and flanges are very effective, when properly designed and installed, to prevent leakage of electromagnetic radiation into and out of the cabinet.

As described thus far, the shielded cabinet, with the sealed panels sealed against EMI by means of the fingerstock, is of conventional construction.

The cabinet is provided with an openable front door 26. The door 26 is also provided with blade-like flanges 36, which extend, without interruption, around the whole rectangle of the door.

The door 26 is double skinned, having an outer skin 37 and an inner skin 38. The flanges are formed in the material of the inner skin 38, as shown.

The posts 28 are so shaped as to define a door frame 39, which is complementary to the shape of the door 26, as shown. The post 28A of the door frame 39 includes a recess 40, which contains seal-strip 45,46 in the form of the above-described fingerstock. The seal-strips 45,46 lie respectively to the inside and the outside of the flange 36 when the door is closed, as is shown in FIG. 2A. FIG. 2B shows the relationship of the flange to the recess at the point where the door is not closed, but the flange is just about to enter the recess: the position termed the seal-start position in this specification.

Between the seal-start position of FIG. 2B and the fully closed position of FIG. 2A the door 26 has moved forward into the door frame 39 through a distance D. The nature of the fingerstock seal-strips 45,46 is such that the flange 36 (and hence the door) cannot be allowed to move sideways (i.e. to left or right in FIG. 2B) to any substantial extent during this (vertical) closing movement of the door.

If such lateral movement of the flange 36 were to take place as the door closes, the seal-strips 45,46 would be damaged and/or the ability of the seal-strips to provide a reliable seal would be impaired.

It should be noted that if the door 26 were mounted upon a simple hinge, with a pivot axis at 47 on the door frame 39, the arcuate path of the door about that pivot axis would necessarily give rise to such a lateral movement of the flange 36. In accordance with the invention, however, the door 26 is not mounted upon a simple hinge.

Rather, the door 26 is mounted upon a two-pivot hinge assembly 48. A bar 49 is pinned at 47 to a bracket 50, which is unitary with the post 28A of the door frame 39; the other end of the bar 49 is pinned, at 54, to a bracket 56, which is unitary with the inner skin 38 of the door 26.

As a result of this two-pivot layout of the hinge assembly, and with a length of the bar 49 of 10 or 12 cm, the door 26 can move forwards (i.e. in the vertically downwards direction in FIGS. 2A,2B) through a substantial distance, of the order of 2 cm, without any appreciable accompanying lateral movement. The forward travel of 2 cm can be accomplished, in fact, for a lateral movement of the flange of barely 0.25 mm; and such a small lateral movement can easily be accommodated within the flexibility of the seal-strips 45,46.

In the hinge assembly 48, it is important that a line joining the two hinge pivot axes 47,54 should lie parallel to the plane of the doorframe 39. The greater the angle of the said line to the plane of the doorframe, the greater will be the unwanted lateral movement of the flange within the recess. In this regard, the designer should provide that the bar 49 is no less than about 10 cm (for a 2 cm forward travel), and should see to it that the said line passes through the geometric parallel (to the plane of the door frame) condition during the traverse of the door from the FIG. 2A position to the FIG. 2B position.

In short, the fingerstock seal-strips 45,46 require the flange 36 to be entered thereinto only along a straight line path: this straight line path is achieved, closely enough, by the two-pivot hinge assembly 48, as described.

As described, the seal strips 45,46 lie in the recess 40.

The recess is dimensioned so that the two seal strips nominally are just about touching each other when the flange 36 of the door is not present. Nominally, the flange passes midway between the two strips, and compresses both equally. Thus, each side of the flange comprises a sealing surface, which may be considered redundant. Inevitably, however, the flange will not pass exactly down the centre of the recess, so that one of the strips 45,46 will be compressed more than the other. Whilst it is sometimes possible to get away with only a single strip, two strips do permit double the misalignment that can be tolerated if only one strip is provided, and this extra tolerance will usually be required.

The flange 36 is shown as doubled-over portions of the inner skin 38 of the door, which is folded flat against itself in FIG. 2A. The fold may be so arranged that the doubled-over portions are spaced apart slightly apart from each other, in order to increase the width of the flange, and to make the blade-edge of the flange more rounded.

As will be described with reference to FIGS. 4A and 4B, the movement of the door 26 from the seal-start position of FIG. 2A to the fully closed position of FIG. 2B is controlled and assisted by the use of latch assemblies 55.

Figure 4A:
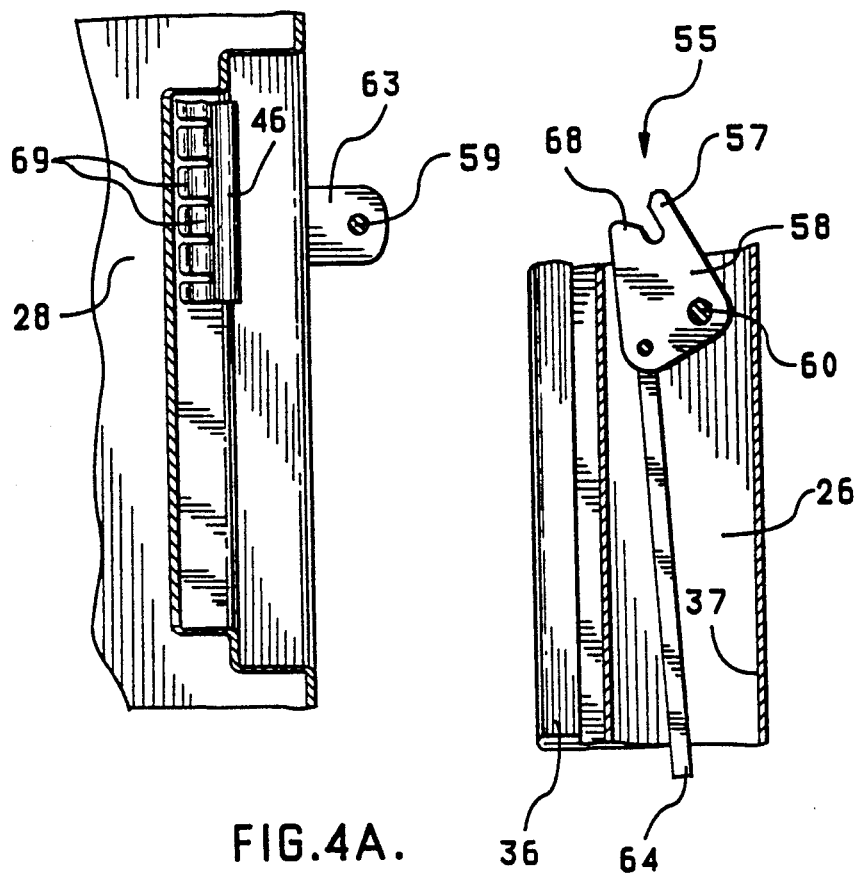
FIG. 4A is a side view of the door assembly of FIG. 1, with the door in an open position, showing a latch mechanism.

In FIG. 4A the door is open; as the door 26 moves to the left, a tongue 57 of a latch lever 58 moves into striking engagement with a latch pin 59. The latch lever 58 is pivoted at 60 to the outer skin 37 of the door, whilst the latch pin 59 is attached to a bracket 63 which is unitary with the post 28A.

Figure 3:
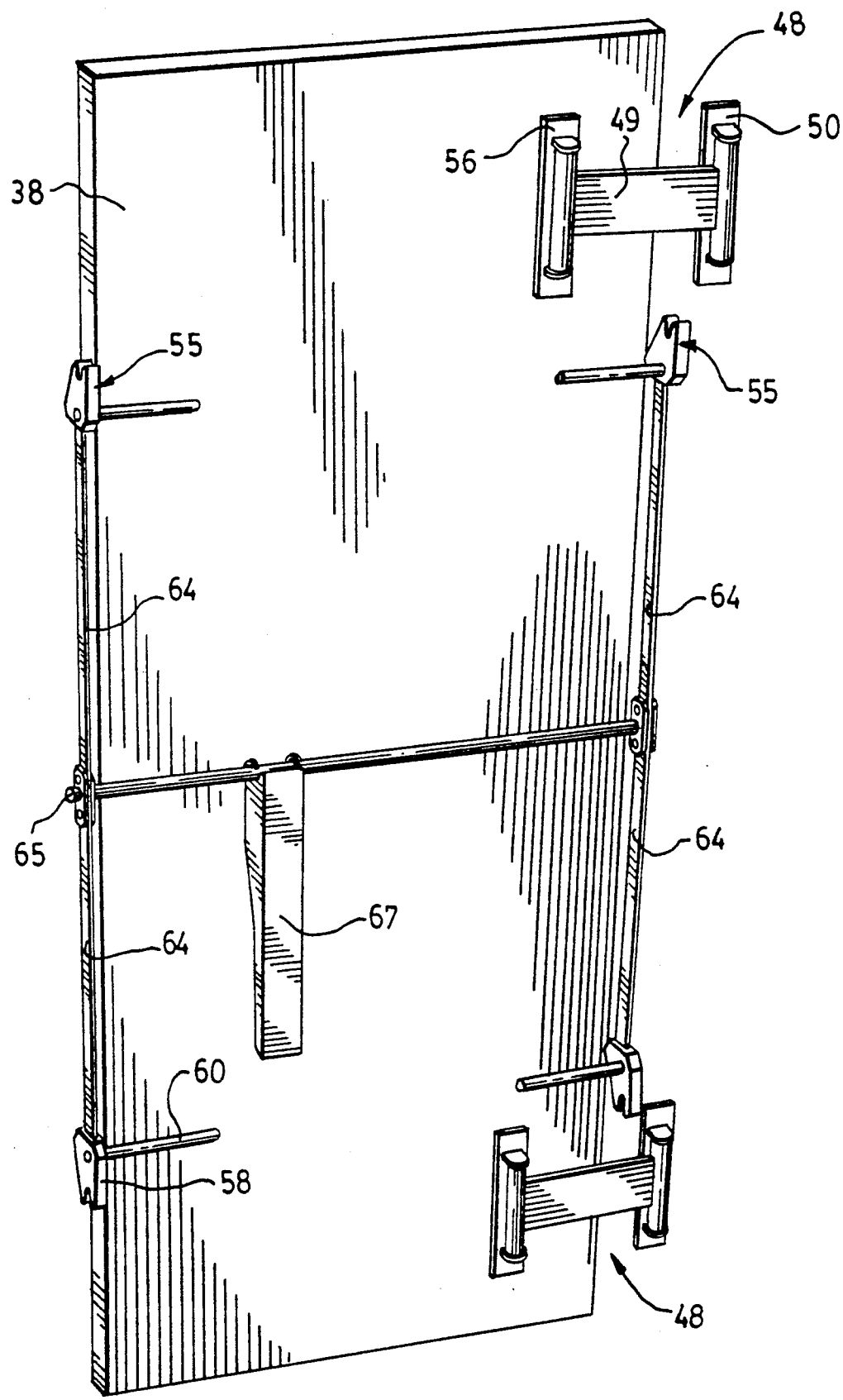
FIG. 3 is a pictorial view of the door assembly of FIG. 1, with a portion of the door removed to expose some of the components thereof.

The latch lever 58 is connected through a rod 64 and a toggle bar 65 to a door handle 67 (FIG. 3). Movement of the door handle 67 is effective to cause rotation of the latch lever 58 (and of the other three latch levers).

As the operator moves the door handle 67, the latch lever 58 rotates—clockwise in FIG. 4A. Upon rotation, a cam 68 on the latch lever enters the space behind the pin 59 on the post 28A, upon further rotation, cam action acts to draw the lever, and with it the door, towards the latch pin 59 and towards the door post 28A. FIG. 4B shows the extent of the rotation of the latch lever when the door has reached the fully closed position.

Figure 4B:
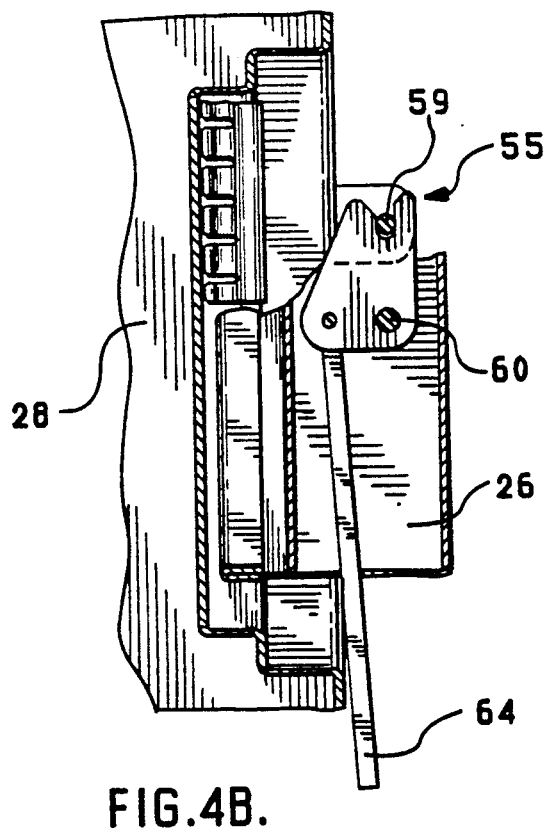
FIG. 4B is the view of FIG. 4A, but with the door in a closed position.

One of the purposes of the latch assembly 55 is to hold the door 26 securely in the closed position (FIG. 2A, FIG. 4B). However, another function of the latch assembly is also important.

The fingers 69 (FIG. 4A) of the fingerstock seal-strips 45,46 are, as mentioned, quite flexible—to the extent that the fingers are easily deflectable with a person's light touch. However, the flange 36 is of a considerable length, since the flange extends round the entire door. A total flange length of around 500 cm is typical, with the result that the aggregate force of all the fingers upon the flange is considerable.

In closing the door, the source of the force required to deflect all the fingers is the force of the push with which the door is closed. In addition to the deflection force of the finger, each finger exerts also a frictional resistance to the movement of the flange. Thus, in a typical case, a force of 800N or so can be required in order to deflect the fingers, to overcome the friction, and to close the door.

It would be difficult for the operator to apply such a force to the door, simply by pushing the door. The latch assemblies 55 provide a means for applying this considerable force in a convenient manner.

To close the door, the operator first swings the door, by hand, from the open position to the seal-start position. In this phase of the movement, the operator may move the door either by pushing the door itself, or by holding the handle 67. Next, when the door is in the seal-start position, the operator checks that the handle 67 is in the position in which the latch levers 58 are ready to receive the latch pins 59. In the FIG. 3 arrangement, in this position of the latch levers, the handle 67 would be protruding outwards from the front face of the door.

Now, the operator operates the door handle 67, i.e. he pushes the handle downwards until the handle lies flush with the door, as shown in FIG. 3. This action cause the latch levers 58 to rotate, which causes the cams 68 to engage behind the pins 59. Forceful rotation of the door handle now causes the door to be drawn into the door frame, against the resistance offered by the seal-strips. A suitable lever ratio is built into the linkage, including the toggle bar 65, through which the rotation of the handle 67 is transferred to the latch levers.

One of the features of the invention lies in the recognition that a suitable lever ratio, as described, can in fact be achieved. As mentioned, a force of about 800N is required to finally close the door against the seal-strips; furthermore, this large force has to be exerted over a considerable distance (2 cm or so) and it would not be acceptable to the operator if this force had to be provided by his pushing the door.

The final closing of the door, between the FIG. 2A position and the FIG. 2B position, thus is accomplished without the operator having to apply a force pushing the door inwards. All he need do is apply a force to the door handle, and the action of forcefully moving the handle is effective to draw the door finally and fully into the door frame, without the operator having to apply any force directly to the door. Thus, the action of the latches is important as the means by which the door can be operated into the fully closed position, apart from the more usual function of the latches, which is to hold the door in the firmly closed position.

Just as the operator is assisted in closing the door by the action of the latches, so similar assistance is provided during opening of the door. When releasing the latches and opening the door, it is necessary to apply a force to pull the door out of the door frame. Each individual finger of the seal strips applies only a tiny force to the flange 36, but, as mentioned, in aggregate the force is large, and gives rise to friction which opposes the opening of the door.

It will be noted that the tongue 57 of the latch lever 58, when the door is being opened, presses against the latch pin 59, and provides a means by which a door-opening force may be applied between the door and the door frame, by the action of operating the door handle 67.

The door, and the manner of sealing the door to the door frame, as described in relation to the FIG. 1 cabinet, may be compared with the conventional gasket-type seal hitherto used in EMI-shielded cabinets. The conventional gasket-type EMI seal comprises a strip or rope of wire mesh, loosely woven, which can be compacted between surfaces by pressure applied therebetween. With such a gasket-type seal, there is a stringent requirement that the door be very flat, and that it be very rigid. If any portion of the sealed length of the gasket should start to separate, then seal integrity would be lost. One of the problems with the compressible gasket type of seal is that a separation of as little as 0.5 mm, or even less, might be critical, and it is difficult (and therefore expensive) to provide an openable door and doorframe in which separation, all around the gasket length, can be kept below such a tiny value, over a resonable service life.

In the cabinet of FIG. 1, however, it may be regarded that the "compression" of the seal—by analogy with the compression of the gasket—takes place in a direction perpendicular to the plane of the door frame. That is to say, the door flange wipes the seal in the direction of door closure: the seal applies its compression laterally relative to the flange. Therefore, the magnitude of the compression of the seal of FIG. 1 etc. is independent of how firmly the door is held closed.

Furthermore, the presence of the large flange surrounding the door inherently serves to make the door rigid. The door as described may be light in weight, and yet have ample rigidity in the sense of resisting separation of the sealed surface.

In fact, it is recognised that separation due to distortion of the FIG. 1 door and frame in service is likely to be of little concern. By contrast, when a cabinet has gasket seals, the over-riding concern of the designer, and of the maintenance and service operators, is constantly to check for, and correct, distortions that can lead to leakage: the FIG. 1 cabinet, once assembled and set up correctly, can be expected to be free from the need of such tiresome routines.

The FIG. 1 cabinet is intended to be shipped in the knocked-down state, and to be finally assembled on-site, i.e. outside factory-controlled procedures and inspections. In such a case, it might be expected that the need for the setting and adjustment of the two-pivot door hinges 48 might lead to considerable problems. However, assembly of the door of the FIG. 1 cabinet is very simple: first, the cabinet is laid flat with the door frame 39 uppermost, i.e. the plane of the door frame is horizontal; then the door 26 is rested upon the seal-strips 45,46; then a check is carried out to ensure that the flange 36 is lined up with the seal strips all around the full circumference of the flange, and a further check is carried out to ensure that the tongues 57 of the latch levers 58 are correctly aligned with the latch pins 59.

At this point, the door handle 67 is operated to draw the door down into the seal strips, and into the fully closed position. Only then need the hinge brackets 50,56 be tightened to the door and to the door frame. When the cabinet is up-ended, the hinges 48 are now at the correct settings for trouble-free operation of the door.

Little is required of the assembly person by way of skill in making measurements and adjustments, since hinge brackets are automatically lying in the right place. The linkage in the door, including the rod 64 and the toggle bar 65, is not adjustable upon assembly, and its geometry is under factory control.

In fact, the assembly as described may be carried out with the cabinet in the normal upright position, though this is slightly more demanding of the care of the assembly person.

The above is not to imply that the cabinet of FIG. 1 can be manufactured and assembled without concern for precision, nor that the door is indestructible: but rather, that the degree of mis-match, bad adjustment, and service abuse which can be tolerated is enhanced, as compared with previous doors on shielded cabinets.

As shown in FIGS. 2A,2B, a window 70 is provided in the outer skin 37 of the door 26, through which the hinge bar 49 can pass. The window 70 is wide enough to permit changes in attitude of the bar 49 relative to the outer skin 37, the extremes of which are shown in FIGS. 2A and 2B respectively.

The door 26 can pivot freely about the secondary hinge axis 54, but only over the very small travel as permitted by the bar 49 within the window 70. This extra mode of movement is generally not disturbing to the operator; however, a spring biassing means may, if desired, be provided for the hinge bar 49, to bias the bar into the FIG. 2B position. Such spring biassing would have to be overcome by an addition to the door closing force, but that would not be too important.

One of the possible disadvantages of the fact that the door can rotate about two hinge axes is that it is possible the operator might mistakenly think he has placed the door in the correct position, where all four latches are engaged, whereas in fact one or more of the latches is not engaged. The use of spring biassing of the hinge bar, as described, would assist even the casual operator in making sure that all the latches were in the correct position to be engaged properly.

Although the cabinet of FIG. 1 is the preferred embodiment of the invention, variations in the structure are contemplated within the broad scope of the invention, some examples of which will now be described.

Figure 5:
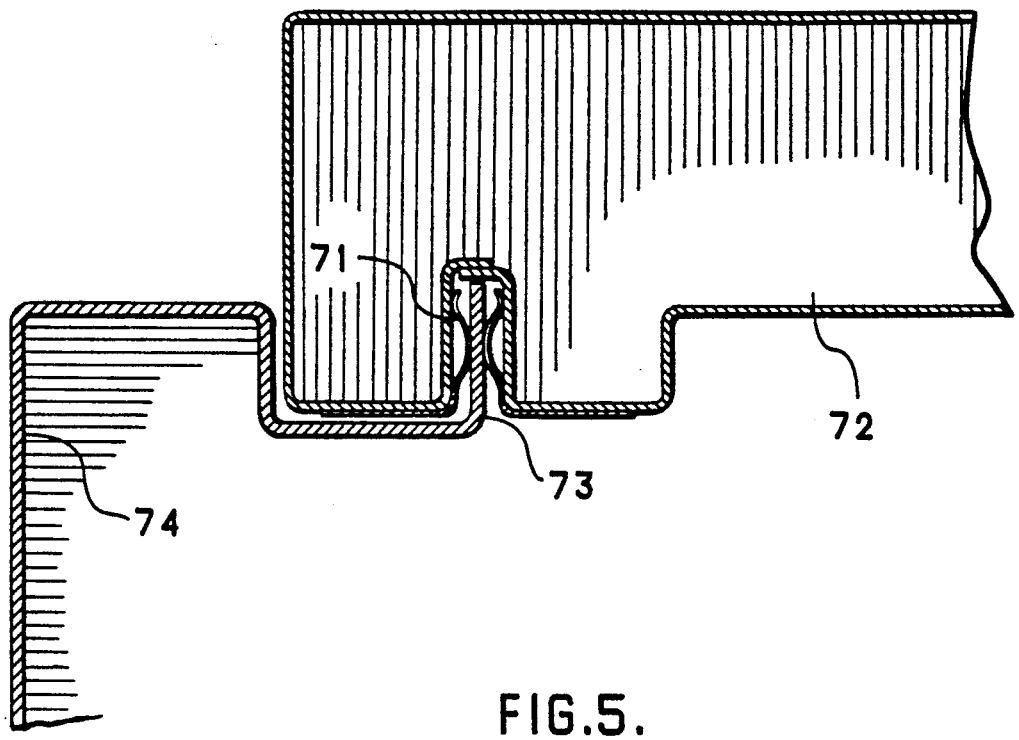
FIG. 5 is a view corresponding to FIG. 2A of another door assembly which embodies the invention.

As shown in FIG. 5, it is contemplated that the seal strips 71 may be mounted on the door 72 itself. In that case, the flange 73 which engages the seal strips 71 is provided on the door post 74.

Figure 6:
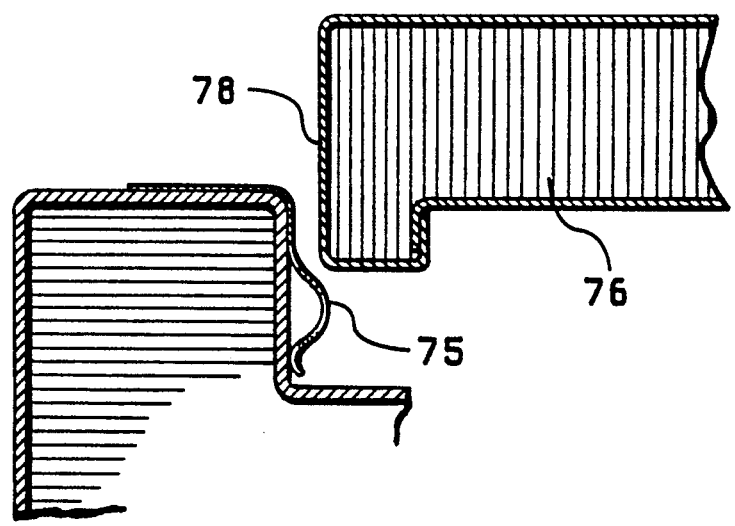
FIG. 6 is a view corresponding to FIG. 2A of a further door assembly which embodies the invention.

As shown in FIG. 6, it is contemplated that, where in the FIG. 1 cabinet two seal strips 45,46 were arranged in pairs in opposition to each other, in fact only one seal strip 75 need be provided in respect of one edge of the door 76. Instead of providing a flange which passes like a blade between the two seal strips, in this case the single seal strip may be arranged to engage directly against an edge surface 78 of the door.

Figure 7:
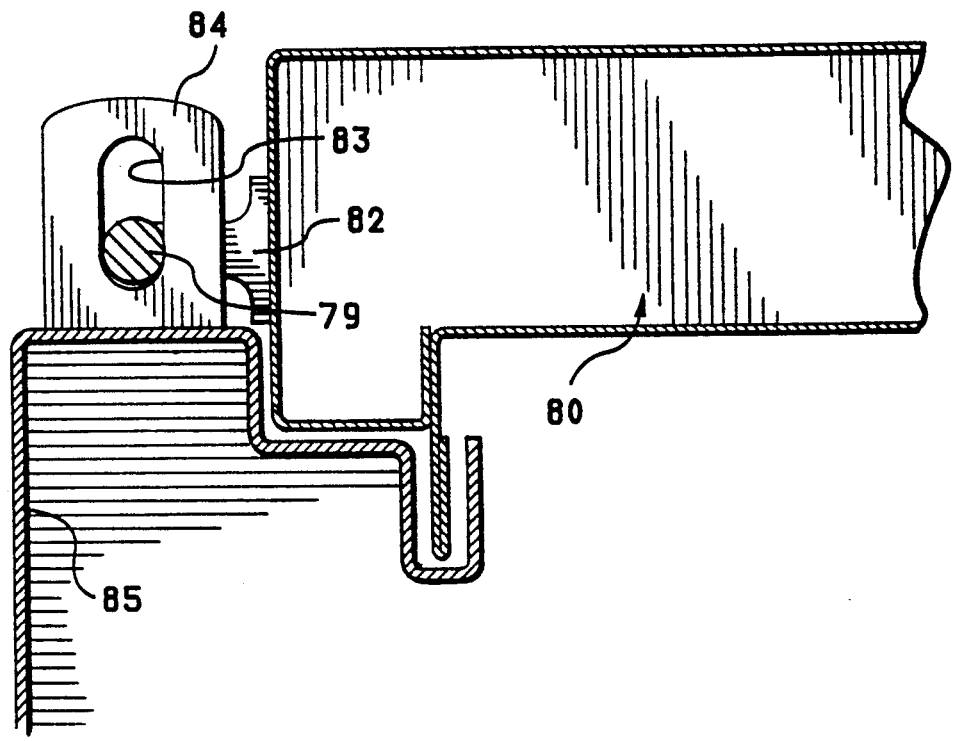
FIG. 7 is a view corresponding to FIG. 2A of yet another door assembly which embodies the invention.

As shown in FIG. 7, it is contemplated that other forms of hinge may be used, which also have a capacity to permit inward movement of the door without associated arcuate movement. In FIG. 7, a hinge pin 79 is made unitary with the door 80 by means of a bracket 82. The hinge pin 79 does not simply engage in a pivot hole, as in a normal hinge, but rather engages a slot 83, as shown. The slot 83 is formed in a bracket 84 which is attached to the door post 85. When the door is open, the door may pivot about the hinge pin 79 which may travel to the outermost end of the slot 83 when the door is open. From the seal-start position (of FIG. 2B) to the fully closed position (as shown in FIG. 7) the door may, because of the slot, travel bodily forwards without lateral arcuate movement.

A spring may be included in the assembly to urge the pin 79 towards the outermost end of the slot 83, so that the door does not tip, or feel loose to the operator, during opening. This may be compared with the spring, which was described as an option, to bias the hinge bar 49 outwards in the FIGS. 2A,2B layout. With or without the spring, the movement of the door other than rotation of the door about the main hinge axis, is quite limited.

Figure 8:
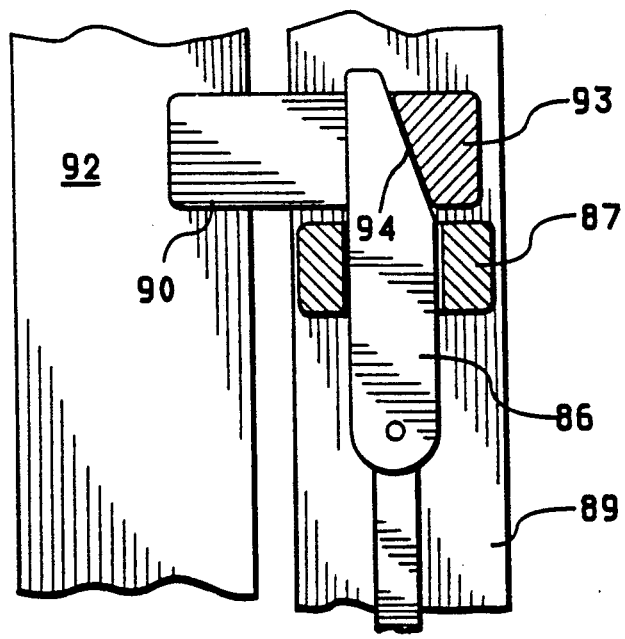
FIG. 8 is a view corresponding to FIG. 4B of yet a further door assembly which embodies the invention.
Figure 9:
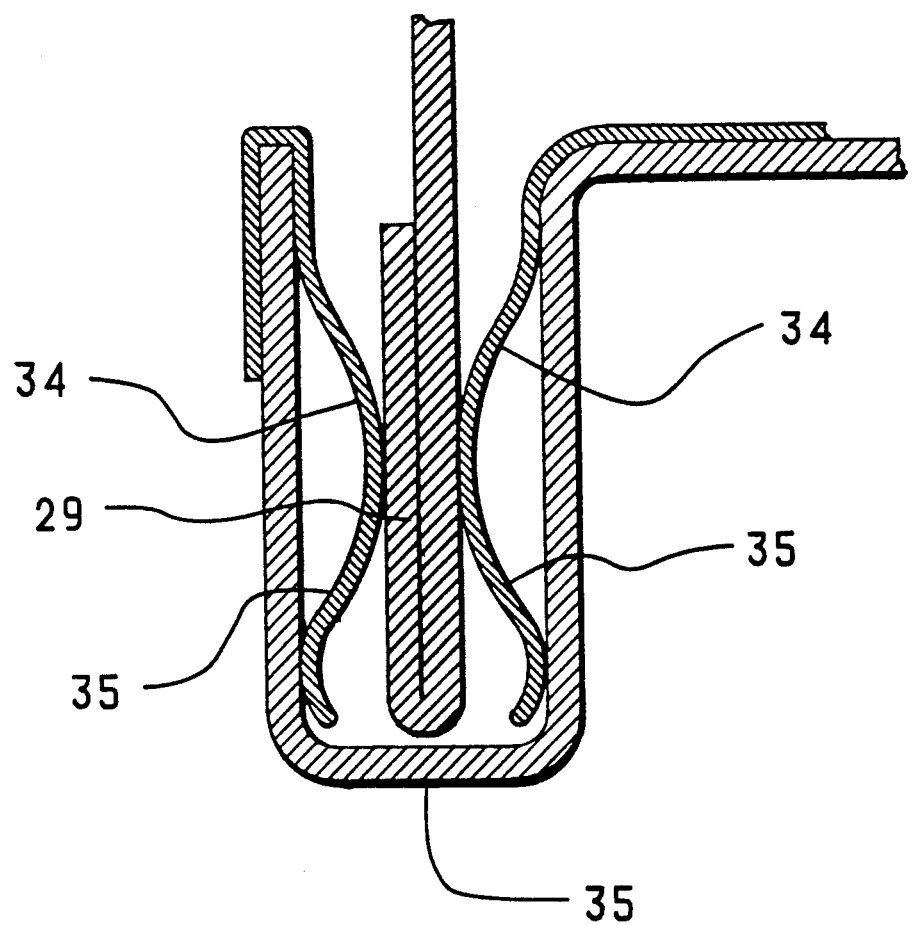
FIG. 9 is a close-up, drawn to a larger scale, of the portion of FIG. 1 indicated by the arrow A in FIG. 1.

As shown in FIG. 8, it is contemplated that the latch need not be in the form of a pivoting lever. In FIG. 8, a latch bar 86 runs between guides 87 which are unitary with the door post 89. A bracket 90 attached to the door 92 provides an abutment 93, against which a ramp 94 of the bar 86 may engage; when the bar 86 is forced upwards, the ramp and abutment interact to draw the door into the door frame.

In the cabinet of FIG. 1, the linkage which operates the latch levers 58 is actuated by turning the door handle 67, and all four latch levers are operated in unison. It is contemplated, within the broad scope of the invention, that each latch may be operated independently, and each have its own operating handle.

As mentioned, the latch assemblies as shown in FIGS. 4A,4B act not only to assist in closing the door, but also to assist in opening the door. The latch bar shown in FIG. 8 has no tongue corresponding to the tongue 57 of the latch lever 58, by means of which an opening-assisting force might have been generated, and this is not preferred, though it is contemplated within the broad scope of the invention.

Four latch levers are shown in FIG. 3, and this number is preferred. As mentioned, the presence of the flange 36 makes the door a substantially rigid structure, but the more latches, especially when the door is a large one, the more the designer can ensure that no portion of the door can be distorted out of the fully sealed condition.

In fact, although the double-skinned door 26 is very rigid in relation to its weight, the door is susceptible to distortion by twisting. Also, the non-hinged movement permitted by the hinge construction as described provides only a small resistance to tipping of the door, i.e. tipping in the sense that the top of the door is forward of the bottom of the door. Preferably, for both these reasons, the hinge side of the door, at least, should have both a top latch and a bottom latch. It is less important, though still preferred, to provide both top and bottom latches, as shown, on the opposite, or non-hinge, side of the door.

On the other hand, the number of latches could theoretically be reduced to a minimum of two—one on the hinge (right) side of the door and one on the left side. Just one latch on the left side would not do: in a door with ordinary hinges, of course the hinges can themselves serve to provide a reaction to a door-clamping force; but when a door has hinges as described, in the fully sealed position the hinges cannot provide any reaction against which the door may be pressed into, and clamped to, the doorframe, and therefore a latch is required also on the hinge side.

The latch assembly 55 serves as a means for reacting door closing (and door opening) forces. The pins 59,60 serve as respective reaction points for the application of forces between the door frame 39 and the door 26. Hence, the task of forcing the door closed may be regarded as the task of drawing these two pins together.

The latch and linkage mechanism, as described, preferably should include the facility for going over-center upon final full closure of the door, whereby the door handle tends to hold itself firmly in place. The over-center facility may be provided in the layout of the travel of the toggle bars 65 during operation of the handle and latches.

It should be noted that, although the hinges do not provide any constraint against the bodily movement of the door into the door frame, the hinges do not permit other modes of movement: the door cannot fall, for instance, because the weight of the door still rests on the hinges; nor can the door move bodily in the horizontal direction parallel to the plane of the doorway; and nor can the door tip or rotate in that plane.

When the door is open, the extra mode of movement permitted by the design of the hinges is not really perceptible, as compared with the large swinging movements of the door that take place when the door is open, although, as mentioned, springs may be provided for biassing the hinge bars, whereby the operator is not aware, when the door is open, that the two-pivot hinges are anything but ordinary single-pivot hinges.

We claim:

1. Door assembly, comprising a doorframe member which defines a doorframe plane, and a door member which defines a door plane, wherein:

one of said members is provided with a sealing surface;

the sealing surface, when the door assembly is closed, lies substantially perpendicular to the doorframe plane;

the other of said members is provided with a seal element which, when the door is closed, lies in operative engagement with the sealing surface;

the seal element includes a resiliently deflectable arm;

the arm of the seal element is deflectable in the direction perpendicular to the sealing surface;

the disposition of the seal element is such that the arm of the seal element is able to rub against the sealing surface with a wiping action, upon closure of the door assembly;

the assembly includes a door hinge sub-assembly;

the door-hinge sub-assembly includes a main hinge, which defines a main hinge axis, about which the door member is pivotable, when open;

the assembly includes a non-hinged movement means;

the non-hinged movement means is effective to guide the door member for bodily movement of the door member relative to the main hinge axis, and for free movement of the door member in a substantially straight line, perpendicular to the doorframe plane, upon closure of the door assembly, from a seal-start position of the door assembly to a fully-closed position of the door assembly;

said seal-start position is a position of the door assembly in which the seal element is just starting to engage the sealing surface;

the assembly includes an operable latching means;

the latching means is effective, when operated, to hold the door member firmly in a fully closed relationship with the doorframe member.

2. Assembly of claim 1, wherein:

the sealing surface is a surface of a flange which is an integral component of the door member;

the flange extends continuously around the periphery of the door member;

the flange has the form of a blade, which extends forwards from the door member towards the doorframe member, perpendicular to the plane of the door member.

3. Assembly of claim 1, wherein the non-hinged movement means includes a bar and a secondary hinge, which defines a secondary hinge axis;

the bar extends between the main hinge and the secondary hinge, and the bar is pivoted to the doorframe member at the main hinge and is pivoted to the door member at the secondary hinge;

the disposition of the bar and the hinges is such that, when the door is closed, or almost closed, a line joining the two hinge axes, in plan view, lies parallel to the doorframe plane;

and the disposition of the bar and the hinges is such that the distance apart of the two axes is great enough that pivoting movement of the bar about the main hinge axis, upon closure of the door assembly from the seal-start position of the door member to the fully-closed position of the door member, entails no more than a negligible travel of the secondary hinge axis in a direction parallel to the doorframe plane.

4. Assembly of claim 1, which includes:

an operable handle means, for receiving a force supplied by a person operating the door;

a linkage means, for converting such force into a force acting between the door member and the doorframe member to urge the door member forcibly into the doorframe member;

a reaction means, for reacting said force against the doorframe member.

and wherein the handle means, the linkage means, and the reaction means, are so disposed and arranged that the door member is forcefully and fully closed into the doorframe member upon operation of the handle means.

5. Assembly of claim 4, wherein the reaction means is incorporated into the latching means.

6. Assembly of claim 4, wherein the handle means, the linkage means, and the reaction means are so disposed and arranged that the door member is forcefully removed, in the door-opening direction, from the doorframe member upon reverse operation of the handle means.

7. Assembly of claim 1, wherein the seal element comprises fingerstock, being a strip of metal wherein the said resiliently deflectable arm, in cross-section of the seal element, is in the form of separated fingers disposed along the length of the strip.

8. Assembly of claim 1, in combination with a cabinet, wherein the door assembly is a component of the cabinet, and the cabinet is of the kind which provides shielding against electromagnetic radiation and interference.

* * * * *